United States Patent [19]

Yoshida et al.

[11] Patent Number: 5,789,975
[45] Date of Patent: Aug. 4, 1998

[54] ANALOG SIGNAL AMPLIFIER AND AUDIO SIGNAL AMPLIFIER

[75] Inventors: Fumito Yoshida, Saitama; Yoshimichi Maejima, Kanagawa, both of Japan

[73] Assignee: Sony Corporation, Tokyo, Japan

[21] Appl. No.: 702,173

[22] Filed: Aug. 23, 1996

[30] Foreign Application Priority Data

Aug. 30, 1995 [JP] Japan ................................. 7-221772

[51] Int. Cl.$^6$ ...................................................... H03F 3/38
[52] U.S. Cl. .................................... 330/10; 330/207 A
[58] Field of Search ................................ 330/10, 207 A, 330/251; 381/120

[56] References Cited

U.S. PATENT DOCUMENTS

| | | | |
|---|---|---|---|
| 4,524,335 | 6/1985 | Yokoyama | 330/10 X |
| 5,160,896 | 11/1992 | McCorkle | 330/207 A X |
| 5,343,161 | 8/1994 | Tokumo et al. | 330/10 |

FOREIGN PATENT DOCUMENTS

| | | |
|---|---|---|
| A-0 171 524 | 2/1986 | European Pat. Off. . |
| A-0 563 421 | 10/1993 | European Pat. Off. . |
| A-0 590 903 | 4/1994 | European Pat. Off. . |

Primary Examiner—Steven Mottola
Attorney, Agent, or Firm—Frommer Lawrence & Haug LLP; William S. Frommer

[57] ABSTRACT

An input limiting circuit limits the maximum signal voltage value of input signal voltage supplied from a signal source through an input terminal. A power amplifying circuit converts the signal voltage from the input limiting circuit to a switching signal having the input signal included in a low frequency component using, for example, a PWM modulation, and then amplifies the output power of the modulated signal using a D-class amplification. A signal demodulating circuit selects the switching frequency signal received from the power amplifying circuit, and demodulates it into a signal similar to the signal generated by the original source. The demodulated signal from the signal demodulating circuit is then supplied to a reproducing device.

4 Claims, 3 Drawing Sheets

ANALOG SIGNAL AMPLIFIER AND AUDIO SIGNAL AMPLIFIER

FIELD OF THE INVENTION

The present invention relates to an analog signal amplifier for amplifying the analog signal or the like, and an audio signal amplifier for amplifying an input audio signal and supplying the amplified audio signal to a reproducing device.

BACKGROUND OF THE INVENTION

In recent years, an audio signal amplifier for amplifying an audio signal has been roughly classified, in view of its operating state during its power amplifying stage, into three kinds of amplifiers including an A class amplifier, a B class amplifier and an AB class amplifier. The use of amplifiers other than the above mentioned amplifiers which have been used has been extremely low.

Most of the A class amplifiers, the B class amplifiers and the AB class amplifiers have used push-pull emitter followers, as the final constructions of their power amplifying stages.

This push-pull emitter follower includes a power device having two components with different polarities as one pair. If the power device is a power transistor, then an NPN type power transistor and a PNP type power transistor are included as one pair.

A brief explanation will be given as to the A class amplifier, the B class amplifier and the AB class amplifier respectively hereinafter. The A class amplifier is provided with the above described two power transistors which constantly operate in an active state. In the B class amplifier, one of the two power transistors operates so as to be always located in a cut-off area when the other is activated. Further, the AB class amplifier has an intermediate operation between the A class amplifier and the B class amplifier and operates so that one power transistor is located in an active area or a cut-off area when the other transistor is in an active area.

Now, the above mentioned push-pull emitter follower will be described specifically. A set of power devices forming the push-pull emitter follower are connected in series between a power supply source and a reproducing device (a speaker) which is a load. Specifically, when the power transistor is employed as an example of the power device, current is supplied from the power supply source ($V_{cc}$) to a power supply source (ground) through the collector terminal of the power transistor, the emitter terminal of the power transistor and the reproducing device.

It is apparent from the above described construction that power supply voltage is divided into voltage applied to a part between the collector terminal and the emitter terminal of the power transistor, and voltage applied to the reproducing device as a load. In other words, since the current supplied to the reproducing device serving as the load always passes between the collector terminal and the emitter terminal of the power transistor, and the above mentioned voltage is applied between these terminals, power is consumed by this power transistor. Further, since this power is not supplied to the reproducing device as the load, power loss is undesirably generated. As a result, heat is produced in an P-N junction of the power transistor. When it is assumed that the power loss consumed by this power transistor is $P_d$, the power loss $P_d$ of the B class amplifier which is the smallest among those of the A class amplifier, the B class amplifier and the AB class amplifier is shown approximately by the following formula:

$$P_d = \frac{2 \times V_{CC} \times V_{out}}{\pi \times R_L} - \frac{V_{OUT}^2}{2 \times R_L} \quad (1)$$

(where a power supply voltage value is $\pm V_{cc}$, the amplitude value of output voltage is $V_{out}$ and the value of load is $R_L$).

As is apparent from this expression, the power loss $P_d$ is a value which depends on the power supply voltage value $V_{cc}$. Generally, when the amplitude value $V_{out}$ of the output voltage and the value $R_L$ of the load are kept constant, the value of the power loss $P_d$ becomes larger as the power supply voltage value increases. This is applicable to both A class amplifier and the AB class amplifier.

In the meantime, when it is assumed that the maximum output power value of an audio signal amplifier for amplifying a sound signal is $W_{MAX}$, $W_{MAX}$ is shown approximately by a formula mentioned below, irrespective of its operating class, namely, the A class amplifier, the B class amplifier and the AB class amplifier.

$$W_{MAX} = \frac{V_{CC}^2}{2 \times R_L} \quad (2)$$

It can be understood from this formula that the maximum output power value $W_{MAX}$ of the audio signal amplifiers is a value which only depends on the power supply voltage value $V_{cc}$ when the value $R_L$ of the load is maintained constant.

In these days, in order to lower the production cost, the structures and parts to be used in a variety of products need to be standardized. In these circumstances, the audio signal amplifier and its power supply source need to be standardized.

The central problem in standardizing the audio signal amplifier and its power supply source resides in the relationship between the above described power supply voltage value and the maximum output power value of the audio signal amplifier, and the power loss during power amplification.

Now, it is supposed that the standardization of the audio signal amplifier and its power supply source is achieved, and the audio signal amplifier having different maximum output power values under the same power supply voltage value is obtained.

Generally, in the case of an ordinary audio signal amplifier, a heat radiator (otherwise known as a heat sink) is mounted on a power device in order to suppress the temperature increase due to power loss generated during the power amplification. In this case, a designer may initially desire to mount a smaller heat sink on the audio signal amplifier having a small maximum output power value. On the contrary, since a larger heat sink cannot be mounted on the audio signal amplifier because of the size limitation of a product or the like, or the output current of the power supply source cannot be sufficiently increased, it may be preferable to limit the maximum output power value of the audio signal amplifier.

As a method to realize the audio signal amplifier having different maximum output power values under the same power supply voltage value $V_{cc}$, as mentioned above, it may be preferable to limit the maximum value of signal voltage input to the audio signal amplifier based on the final gain of the audio signal amplifier. In this case, the output voltage of the audio signal amplifier is expressed by: (input signal voltage)×(final gain of audio signal amplifier). Therefore, when the maximum value of the signal voltage input to the audio signal amplifier is limited, the maximum output power value of the audio signal amplifier is also limited.

As stated above, however, since the power $P_d$ dissipated in the power transistor greatly depends on the power supply voltage value $V_{cc}$, even if the maximum output power value is limited by the maximum input voltage value, the value of the power $P_d$ consumed by the power transistor is hardly changed as compared to that of the audio signal amplifier having an original maximum output power value. Therefore, the heat sink must have a size similar to that of the audio signal amplifier having its original maximum output power. Consequently, the limitation on the maximum voltage value of the input signal will be meaningless.

In addition, as another method for limiting the maximum output power value while the power supply voltage value $V_{cc}$ is maintained constant, a method may be considered in which the magnitude of the maximum input voltage is predetermined and the final gain of the audio signal amplifier is set based on the predetermined magnitude. With this method, however, it is impossible to make the value of the power $P_d$ dissipated in the power transistor smaller than that of the power $P_d$ dissipated in the power transistor of an audio signal amplifier having an original maximum output power value.

In conclusion, when the reproducing device acting as a load is determined, only by lowering the power supply voltage to the audio signal amplifier, the maximum output power value in the A class amplifier, B class amplifier and the AB class amplifier which are currently used can be limited, the power loss during the power amplification can be reduced, and the heat sink can be made compact.

It is to be noted that the same problems, as mentioned above, arise when the power supply source of a signal amplifier for various analog signals such as video signals, sensor signals of measuring instruments, etc., as well as the audio signal amplifier is standardized.

SUMMARY OF THE INVENTION

One object of the present invention is to provide an improved analog signal amplifier and an improved audio signal amplifier in which a maximum output power value can be varied and a heat sink can be made compact depending on the limiting operation of the power loss, while a power supply voltage value is kept constant.

In order to achieve the above mentioned object, in accordance with one aspect of the present invention, there is an analog signal amplifier including an input limiting means for limiting the maximum signal voltage value of an input analog signal, and power amplifying means for converting the signal output from the input limiting means into a switching signal contained in a low frequency component, for amplifying power and for outputting the amplifier switching signal.

Further, in accordance with another aspect of the present invention, an audio signal amplifier is provided for amplifying an input audio signal, and for supplying the amplified audio signal to an audio reproducing device, including input limiting means for limiting the maximum signal voltage value of the input audio signal, and voltage/power amplifying means which convert signal voltage output from the input limiting means into information represented by the signal width, to amplify and output it as power.

Specifically, in accordance with the analog signal amplifier, the maximum voltage value of the input analog signal is limited by the limiting means, the output thereof is sent to the power amplifying means and converted into a switching signal so that the input signal becomes the low frequency component, and then power is amplified.

Further, in accordance with the audio signal amplifier, the maximum voltage value of the input audio signal is limited by the input limiting means, the output thereof is sent to the power amplifying means, and converted into the information represented by the signal width. Then the converted information is amplified and output.

DESCRIPTION OF THE PREFERRED EMBODIMENT

Figure 1:
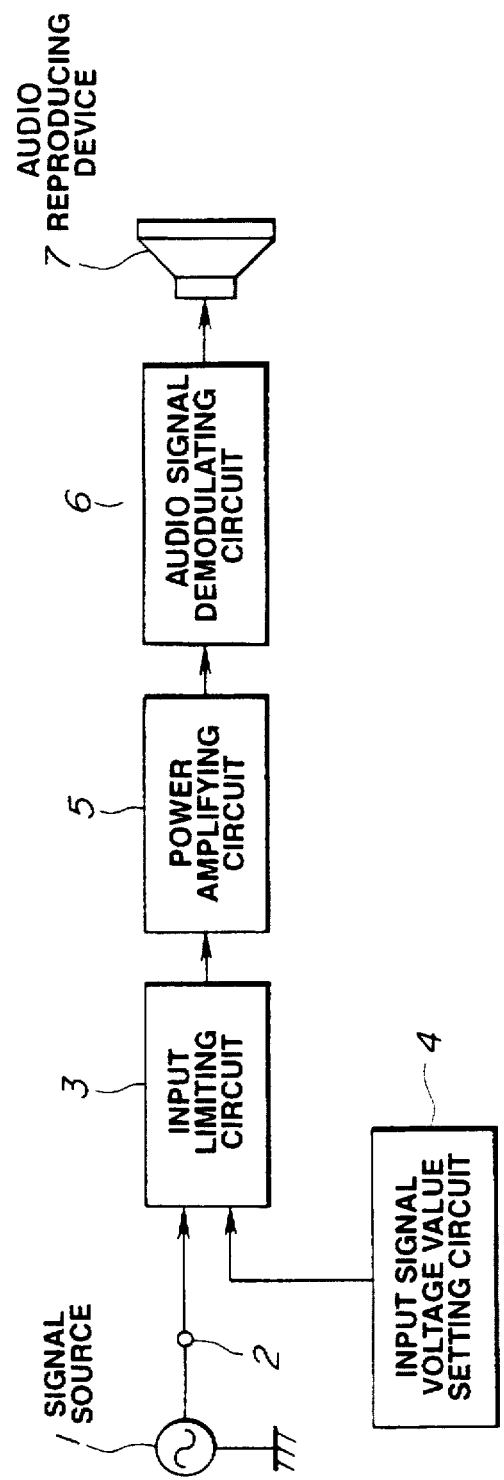
FIG. 1 is a block diagram illustrating an audio signal amplifier as one embodiment according to the present invention.

Referring to the drawings, a description will be given of an embodiment of an audio signal amplifier according to the present invention.

In an audio signal amplifier of an embodiment of the present invention, as shown in FIG. 1, an input signal in the form of voltage change which is supplied from a signal source 1 is received through an input terminal 2, a voltage value is limited by an input limiting circuit 3, signal power is amplified by a power amplifying circuit 5, and an audio signal is supplied to an audio reproducing device 7. Herein, the power amplifying circuit 5 is adapted to convert the signal from the input limiting circuit 3 to a switching signal of a low frequency component, amplify the signal power and output the switching signal. For example, in such a power amplifying circuit, by temporarily converting the amplitude information of input signal voltage into the information along the temporal direction by a pulse width modulation (PWM) or the like, a power supply voltage value to the audio signal amplifier is kept constant, and then the converted information is supplied to a so-called D class amplifying part which is a switching circuit for the power amplification.

Now, the construction and operation of respective components will be described in detail.

Figure 2:
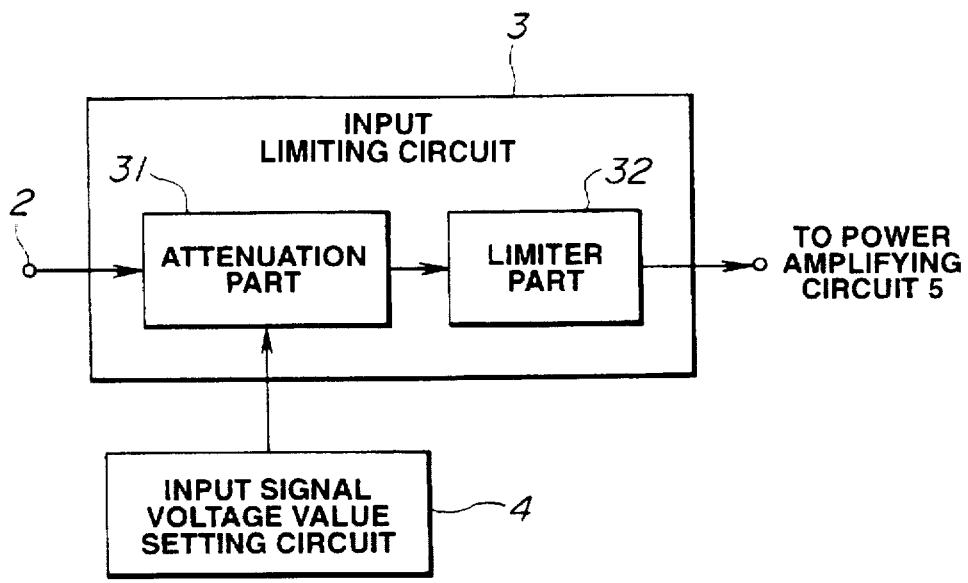
FIG. 2 is a block diagram illustrating an example of an input limiting circuit 3 employed for the audio signal amplifier shown in FIG. 1.

The input signal voltage supplied from the signal source 1 through the input terminal 2 is supplied to the input limiting circuit 3. This input limiting circuit 3 is adapted to limit the input voltage value depending on the limit of the maximum output power value of the audio signal amplifier. The power limited output is supplied to the power amplifying circuit 5. The input limiting circuit 3, as show in FIG. 2, includes an attenuation part 31 and a limiter part 32. The attenuation part 31 is a circuit controlled by an input signal voltage setting circuit 4 and controls the amplitude of the input signal voltage depending on a signal supplied from this circuit 4. The signal voltage output from the attenuation part 31 is sent to the limiter part 32 in which the maximum value of the above described signal voltage is determined. In other words, this input limiting circuit 3 determines the final maximum output voltage value of the audio signal amplifier according to the present embodiment of the invention.

Assuming that a maximum signal voltage value capable of passing through the input limiting 3 is $V_{INMAX}$, and the final gain of the audio signal amplifier is $A_G$, the final maximum output voltage value $V_{MAX}$ of the audio signal amplifier can be expressed by:

$$V_{MAX} = V_{INMAX} \times A_G \quad (3)$$

Herein, the maximum signal voltage value passing through the input limiting circuit 3 is determined by the limiter part 32 in the input limiting circuit 3, as mentioned above. Based on the expression (the maximum output voltage value of an audio signal amplifier to be set)/$A_G$, the maximum signal voltage value of the input limiting circuit 3 is set by the limiter part 32 in this input limiting circuit 3.

As the attenuation part 31 of the input limiting circuit 3, for example, a variable attenuator such as an electronic volume control may be used and the amount of attenuation may be varied by the input signal voltage value setting circuit 4. As the limiter part 32, for example, an ordinary limiter circuit such as a diode limiter or a soft limiter circuit using level compression by a VGA (variable gain amplifier) or the like may be employed. When the maximum output power of the amplifier need to be different from that of a previous one, the limiter part 32 may be replaced by a new one with a different limit voltage, or the limit voltage may be changed by using a limiting circuit in which the limit voltage can be adjusted.

Then, the power amplifying circuit 5 shown in FIG. 1 applies a PWM modulation to the signal voltage from the input limiting circuit 3 so that the amplitude information of the signal voltage is converted into the information along the temporal direction and a power amplification is carried out by a so-called D-class amplification. A D-class amplifier is adapted to control the switching by a binary operation such as turning on/off a power transistor and output a PWM modulated power signal. The maximum value of power efficiency is 100% and, therefore, the consumed power of the transistor can be greatly reduced.

Figure 3:
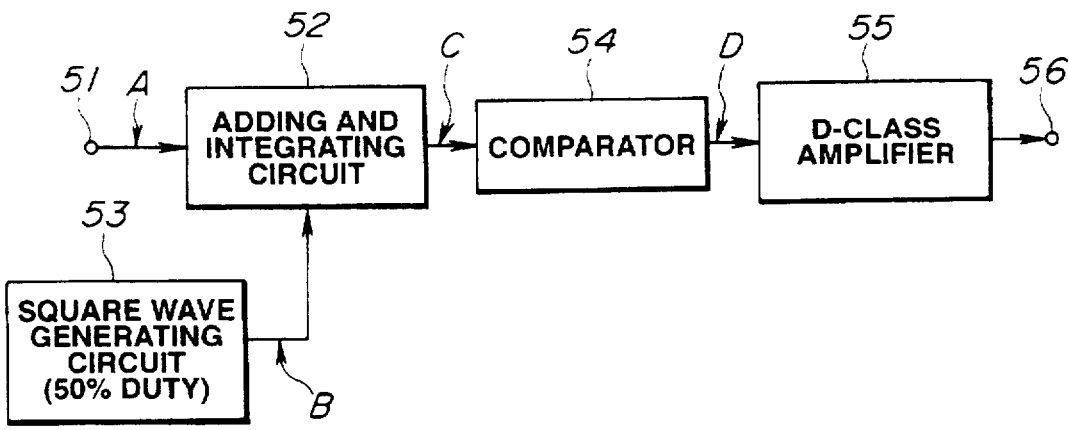
FIG. 3 is a block diagram illustrating an example of a power amplifying circuit 5 used for the audio signal amplifier shown in FIG. 1.
Figures 4A, 4B, 4C, 4D:
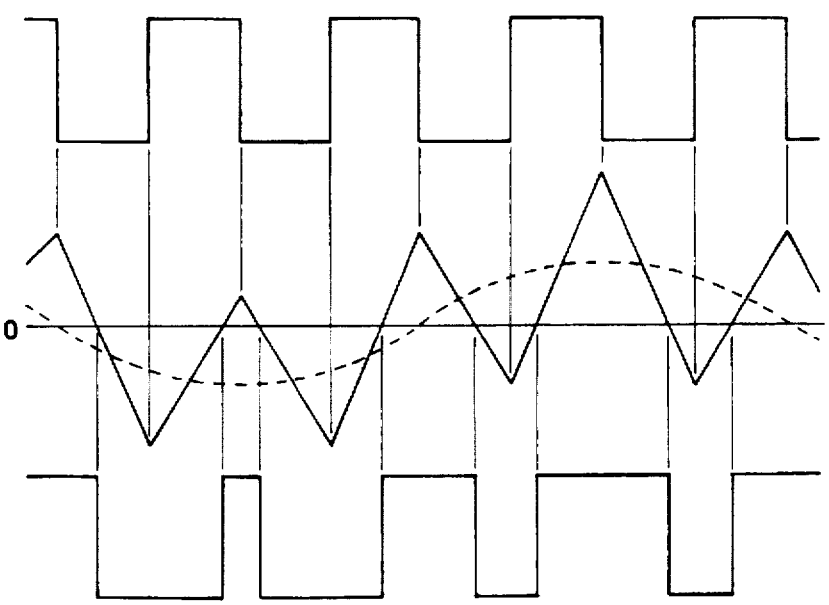
FIG. 4 is a waveform representation for explaining the operation of the circuit shown in FIG. 3.

FIG. 3 illustrates an example of the specific construction of the above described power amplifying circuit 5. FIG. 4 illustrates the signal waveforms of the respective parts shown in FIG. 3. Referring to FIG. 3, for example, an output voltage from the input limiting circuit 3 as shown in FIG. 4A is supplied to an adding and integrating circuit 52 through an input terminal 51. For example, a square wave of 50% duty cycle as shown in FIG. 4B is supplied to the adding and integrating circuit 52 from a square wave generating circuit 53. These signals are added and integrated in the adding and integrating circuit 52, so that a signal with a waveform as shown in FIG. 4C is obtained such that this signal is sent to a comparator 54. The waveform shown in FIG. 4C is formed by superimposing the signal with the waveform shown by broken lines and similar to that shown in FIG. 4A on a triangular wave. The resultant waveform is compared with zero level in the comparator 54, so that a rectangular wave signal as shown in FIG. 4D is obtained. This rectangular wave signal includes the signal shown in FIG. 4A in its low frequency component. This rectangular wave signal is amplified by a so-called D class amplifier 55 to obtain a rectangular wave signal having the amplitude substantially equal to that of source voltage. The obtained rectangular wave signal is output from an output terminal 56. An output signal from the output terminal 56 is supplied to an audio signal demodulating circuit 6 as the output of the power amplifying circuit 5 illustrated in FIG. 1.

The audio signal demodulating circuit 6 shown in FIG. 1 removes a switching frequency included in the output signal of the power amplifying circuit 5 and demodulates this output signal to a signal similar to the one of the original signal source. Then, the demodulated signal from the audio signal demodulating circuit 6 is supplied to the audio reproducing device 7 so that the speaker reproducing device 7 is driven.

The audio signal demodulating circuit 6 includes a low-pass filter so that the switching frequency included in the output signal of the power amplifying circuit 5 is removed and the output signal is demodulated to a signal similar to that of the original signal source. This demodulated signal is supplied to the audio reproducing device 7 so as to drive the device 7.

Generally, heat generated due to power loss in the audio signal amplifier occurs during the power amplification. According to the invention, since all of the information of the input signal voltage is modulated into the information along the temporal direction, the power supply voltage value applied to the power amplifying circuit 5 during the power amplification is not related to the power loss in this audio signal amplifier.

Assuming that the saturation voltage of a power transistor in the D class amplifying part of the power amplifying circuit 5 is $V_{SAT}$, output current is $I_{OUT}$, the basic switching period of the D class amplifying part is T, the rise time $t_r$ and the fall time $t_f$ of a basic switching waveform (square wave) in the D class amplifying part are sufficiently short, the power loss $P_{Dd}$ in the audio signal amplifier is approximately shown by the following formula:

$$P_{Dd} = \frac{1}{T} \times \int_0^T (V_{SAT} \times I_{OUT}) dt \quad (4)$$

Herein, when it is assumed that $V_{SAT}$ is constant, based on the output current, the power loss can be determined precisely.

Accordingly, since the limitation on the input signal voltage value causes the output current to be limited, which is supplied through the audio signal demodulating circuit 6 to the audio reproducing device 7 serving as a load, the power loss during the power amplification is also simultaneously limited. Consequently, the maximum output power value can be varied without changing the power supply voltage value and a heat sink can be made compact in accordance with the reduction of the power loss.

As mentioned above, according to the audio signal amplifier of the present invention, the amplitude information of the input signal voltage is temporarily converted into information represented by signal width in the power amplifying circuit 5 so that it is not correlated with the power supply voltage value supplied to the power amplifying circuit 5 in the course of power amplification. As a result, the maximum output power value can be varied without changing the power supply voltage value and the size of the heat sink can be reduced based on the power loss reduction.

It is to be noted that the present invention is not limited only to the above described embodiment. As an input analog signal, for example, not only an audio signal but also various kinds of analog signals such as video signals, sensor signals of measuring instruments, etc., which require the power amplification, can be employed.

In addition, instead of the PWM (pulse width modulation) in the power amplifying circuit, means capable of converting the output signal from the input limiting means into the switching signal having an original analog signal included in the low frequency component, such as a PPM (pulse phase modulation), a PNM (pulse number modulation) or $\Delta\Sigma$ modulation, may be employed.

As mentioned above, the analog signal amplifier of the present invention includes the input limiting means for limiting the maximum signal voltage value of the input analog signal and the power amplifying means for converting the signal output from the input limiting means into the switching signal included in the flow frequency component, and for amplifying and outputting the switching signal. Thus, the maximum output power can be varied while the power supply voltage value is kept constant, the power loss can be reduced and the heat sink or the like can be applied in accordance with its maximum output power.

Further, according to the audio signal amplifier of the present invention, in addition to the above described effects, the maximum output power voltage to the audio reproducing device can be varied and the size of the heat sink can be decreased depending on the power loss limitation.

What is claimed is:

1. A signal amplifier for amplifying an information carrying signal, comprising:

a signal source for generating said information carrying signal;

a limiting circuit coupled to said signal source including attenuation means for variably adjusting a voltage amplitude of said information carrying signal and limiting means for limiting said voltage amplitude of the adjusted signal to a maximum value in response to said attenuation means;

a setting circuit coupled to said limiting circuit for controlling said attenuation means;

an amplifying circuit coupled to said limiting circuit for converting the adjusted signal to a plurality of pulses such that information represented by said voltage amplitude corresponds to said information represented by widths of the pulses, said amplifying circuit further including means for amplifying an amplitude of each of the pulses;

a demodulating circuit coupled to said amplifying circuit for demodulating the pulses to produce an amplified information carrying signal; and a reproducing device for reproducing said information based on said amplified information carrying signal.

2. The signal amplifier according to claim 1, wherein said amplifying circuit includes a square wave generator for generating a square wave signal, an adding and integrating circuit for adding said square wave signal and the adjusted signal and for integrating a first signal resulting from the addition, a comparator for comparing a level of a second signal generated by said adding and integrating circuit to a predetermined level, and a class D amplifier for amplifying a third signal generated by said comparator.

3. The signal amplifier according to claim 1, wherein said demodulating circuit is adapted to select a low frequency component from the pulses generated by said amplifying circuit.

4. The signal amplifier according to claim 1, further comprising a power supply for generating a supply voltage signal having a substantially constant amplitude.

* * * * *